United States Patent
Niederberger et al.

(10) Patent No.: US 11,140,493 B2
(45) Date of Patent: Oct. 5, 2021

(54) INPUT CURRENT-TOLERANT AMPLIFIER INPUT STAGE FOR MEMS SENSORS AND OTHER DEVICES

(71) Applicant: ams International AG, Jona (CH)

(72) Inventors: Mark Niederberger, Einsiedein (CH); Lukas Perktold, Hinwil (CH)

(73) Assignee: ams International AG, Jona (CH)

( * ) Notice: Subject to any disclaimer, the term of this patent is extended or adjusted under 35 U.S.C. 154(b) by 0 days.

(21) Appl. No.: 16/754,182

(22) PCT Filed: Oct. 17, 2018

(86) PCT No.: PCT/EP2018/078399
§ 371 (c)(1),
(2) Date: Apr. 7, 2020

(87) PCT Pub. No.: WO2019/076981
PCT Pub. Date: Apr. 25, 2019

(65) Prior Publication Data
US 2021/0067881 A1 Mar. 4, 2021

Related U.S. Application Data

(60) Provisional application No. 62/573,199, filed on Oct. 17, 2017.

(51) Int. Cl.
*H03G 5/00* (2006.01)
*H04R 19/04* (2006.01)
(Continued)

(52) U.S. Cl.
CPC ............... *H04R 19/04* (2013.01); *H03F 3/70* (2013.01); *H04R 3/04* (2013.01); *H03F 2200/03* (2013.01);
(Continued)

(58) Field of Classification Search
CPC ........................................................ H03G 5/00
See application file for complete search history.

(56) References Cited

U.S. PATENT DOCUMENTS 6,873,206 B1   3/2005  Hildebrant et al.
9,287,839 B1 *  3/2016  Amadi ................ H03F 3/45475
(Continued)

FOREIGN PATENT DOCUMENTS

EP   2211458 A1   7/2010
EP   2978241 A1   1/2016
(Continued)

OTHER PUBLICATIONS

International Preliminary Report on Patentability for Application No. PCT/EP2018/078399 dated Apr. 21, 2020 (7 pages).
(Continued)

*Primary Examiner* — Olisa Anwah
(74) *Attorney, Agent, or Firm* — Michael Best and Friedrich LLP

(57) ABSTRACT

An interface circuit comprises a signal path including a front-end charge amplifier coupling an input of the interface circuit to an output of the interface circuit, and a DC control loop separate from the signal path. In some implementations, the interface circuit is part of a MEMS sensor that includes a MEMS transducer having an output coupled to the input of the interface circuit. The interface circuit can, in some cases, allow faster settling of the circuit to its steady-state operating point.

19 Claims, 5 Drawing Sheets

(51) Int. Cl.
*H03F 3/70* (2006.01)
*H04R 3/04* (2006.01)

(52) U.S. Cl.
CPC .. *H03F 2200/165* (2013.01); *H04R 2201/003* (2013.01)

(56) References Cited

U.S. PATENT DOCUMENTS

| | | | |
|---|---|---|---|
| 2005/0151589 A1* | 7/2005 | Fallesen | H03F 1/301 330/259 |
| 2006/0273805 A1 | 12/2006 | Peng et al. | |
| 2008/0310655 A1* | 12/2008 | Holzmann | H04R 3/00 381/122 |
| 2009/0046870 A1* | 2/2009 | Turnbull | H04R 3/00 381/95 |
| 2009/0072903 A1* | 3/2009 | Bae | H03F 3/45475 330/254 |
| 2013/0195291 A1 | 8/2013 | Josefsson | |
| 2016/0011615 A1* | 1/2016 | Hu | G05F 1/565 323/281 |
| 2017/0111012 A1 | 4/2017 | Jennings et al. | |
| 2019/0207569 A1* | 7/2019 | Rocca | H03F 3/185 |

FOREIGN PATENT DOCUMENTS

| | | |
|---|---|---|
| EP | 3023794 A2 | 5/2016 |
| EP | 3200345 A1 | 8/2017 |
| WO | 32086795 A1 | 10/2002 |
| WO | 2010056236 A1 | 5/2010 |

OTHER PUBLICATIONS

International Search Report issued for corresponding International Application No. PCT/EP2018/078399 dated Feb. 12, 2019.
Search Report issued from the Swiss Patent Office for related Application No. CH12662017 dated Jan. 5, 2018 5 Pages including the Statement of Relevance).
Office Action issued from the European Patent Office for related Application No. 18792893.2 dated Jun. 10, 2021 (7 Pages).

* cited by examiner

INPUT CURRENT-TOLERANT AMPLIFIER INPUT STAGE FOR MEMS SENSORS AND OTHER DEVICES

CROSS REFERENCE TO RELATED APPLICATIONS

This patent application is the U.S. national stage entry, under 35 U.S.C. § 371, of International Application No. PCT/EP2018/078399, filed Oct. 17, 2018, which claims priority to U.S. Provisional Patent Application No. 62/573,199 filed Oct. 17, 2017, the entire contents of which are hereby incorporated by reference.

FIELD OF THE DISCLOSURE

The present disclosure relates to input current-tolerant amplifier input stages for micro electro mechanical system (MEMS) sensors and other devices.

BACKGROUND

A MEMS sensor can be provided as an integrated circuit chip including a MEMS transducer that converts acoustic pressure waves to electrical signals and including a MEMS interface circuit. In some cases, the MEMS transducer is bonded to the integrated circuit. The MEMS transducer, which is biased by a voltage, can be configured, for example, as a MEMS microphone having a variable capacitor that changes its capacitance based on a sound pressure impacting on the membrane of the MEMS transducer. The MEMS interface circuit includes an amplifier to amplify an input signal provided by the MEMS transducer and to generate an amplified output signal. In order to achieve a high-pass roll-off frequency well below the audible frequency range, the input impedance of the amplifier should have a very high impedance (e.g., >1TΩ).

After start-up, the bias voltage will rise from zero to its steady-state voltage, for example, within several 10 ms to a few 100 ms. The bias voltage leads to an electric force on the MEMS membrane and allows the membrane to move towards its steady state position. Settling of the MEMS membrane depends also on the acoustic design of the microphone and also can take several 10 ms.

Fast start-up settling of the microphone outputs is becoming increasingly important for some applications. In some known MEMS interface circuits, however, the circuit's transfer function depends on the input current. As the input current increases, the feedback loop in the amplifier circuit may become unstable. Some solutions have been proposed, but can result in the high-pass roll-off frequency of the signal path being too high.

SUMMARY

The present disclosure describes input current-tolerant amplifier input stages for MEMS microphones and other devices.

In one aspect, for example, the disclosure describes an interface circuit comprises a signal path including a front-end charge amplifier that couples an input of the interface circuit to an output of the interface circuit. The interface circuit also includes a DC control loop separate from the signal path.

In another aspect, the disclosure describes a MEMS sensor comprising an interface circuit having an input and an output, and a MEMS transducer having an output coupled to the input of the interface circuit. The interface circuit includes a signal path including a front-end charge amplifier that couples the input of the interface circuit to the output of the interface circuit, and a DC control loop separate from the signal path.

Some implementations include one or more of the following features. For example, the front-end charge amplifier can have an input operating point and a low frequency gain, and the DC control loop can include a second amplifier having an input operating point and a low frequency gain that are the same as for the front-end charge amplifier. The interface circuit can be configured such that the front-end charge amplifier is not part of the DC control loop.

In some instances, the DC control loop includes an integrator or low-pass filter coupled to an output of the second amplifier, a first high resistance circuit element is coupled between an output of the integrator or low-pass filter and an input of the second amplifier, and a second high resistance circuit element is coupled between the output of the integrator or low-pass filter and an input of the front-end charge amplifier. The interface circuit further can include a capacitor coupled between the output of the integrator or low-pass filter and the input of the second amplifier.

In some instances, the DC control loop includes an integrator or low-pass filter, and first and second high resistance circuit elements are coupled between an input of the front-end charge amplifier and an input of the second amplifier. The interface circuit further can include a capacitor coupled between an output of the integrator or low-pass filter and the input of the second amplifier.

In some implementations, at least one of the first or second high resistance circuit elements includes a pair of anti-parallel diodes. In some cases, a first switch is in parallel to the first high resistance circuit element, and a second switch is in parallel to the second high resistance circuit element or the capacitor. The first and second switches can be configured to be closed during a start-up operation and/or after occurrence of an overload condition.

In some implementations, the MEMS transducer is configured as a MEMS microphone.

The architectures described here, in which a DC control loop is separate from the signal path, also can be applied to differential input amplifiers.

Some implementations include one or more of the following advantages. For example, the frequency characteristics and stability of the DC feedback loop can be made substantially independent of the current into the interface circuit. The interface circuit can, in some cases, allow faster settling of the interface circuit to its steady-state operating point.

Other aspects, features and advantages will be apparent from the following detailed description, the accompanying drawings, and the claims.

DETAILED DESCRIPTION

Figure 1:
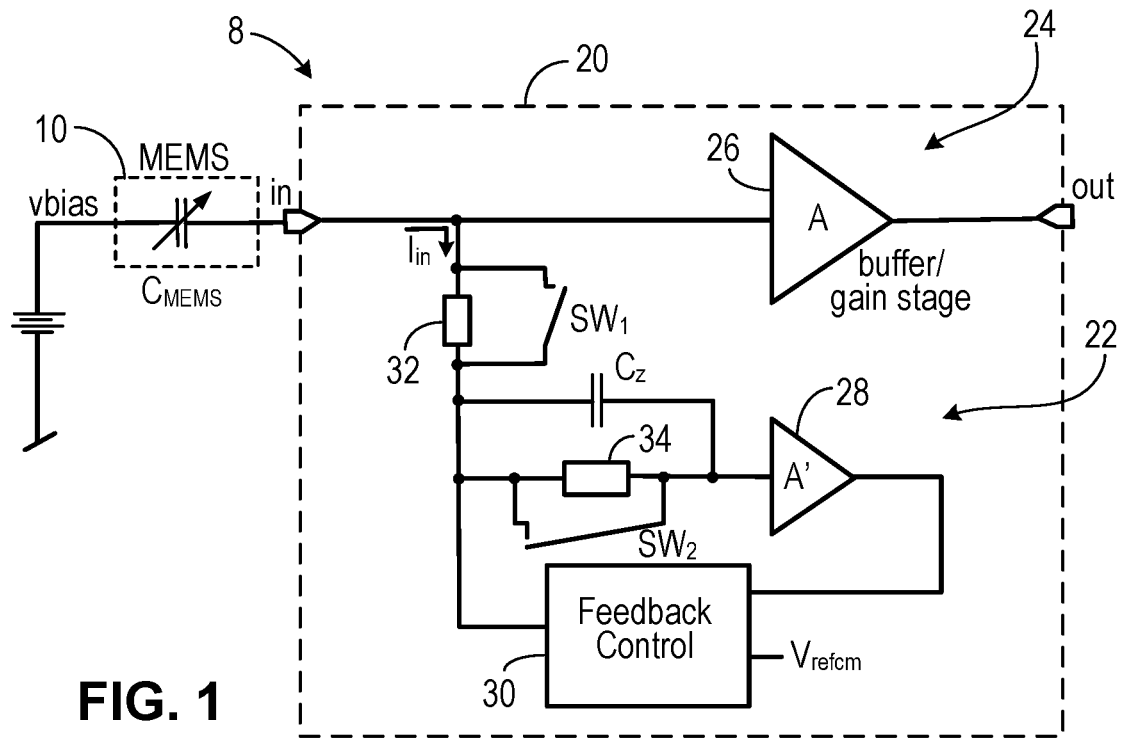
FIG. 1 illustrates an example of a MEMS transducer coupled to an interface circuit.

As shown in FIG. 1, a MEMS sensor 8 includes a MEMS transducer 10 coupled to an interface circuit 20. In some implementations, the MEMS transducer 10 and interface circuit 20 are housed in a common casing of the MEMS sensor.

The MEMS transducer 10 can be implemented, for example, as a variable capacitor whose value is sound pressure-dependent. The MEMS transducer is connected between a bias voltage (Vbias) and the input (in) of the interface circuit 20 such that an input signal of the MEMS transducer 10 can be applied to the interface circuit 20. The required bias voltage (Vbias) depends on the transducer 10, but in some instances is in the range of 5V-50V, or even higher. In some instances, the MEMS transducer 10 is configured as a MEMS microphone.

The input signal received by the interface circuit 20 from the MEMS transducer 10 is amplified by a front-end charge amplifier 26 that generates an amplified output signal at the output terminal (out) of the interface circuit 20. The interface circuit 20 can have either an analog output or a digital output. In the latter case, the front-end charge amplifier 26 drives an analog-to digital converter. The interface circuit 20 thus includes a signal path 24 coupling the circuit's input (in) to its output (out). Thus, the signal path 24 includes the front-end charge amplifier 26 and, if present, the analog-to digital converter.

The interface circuit 20 also includes a DC control loop 22, which also may be referred to as a DC feedback loop or a DC regulation loop. The DC control loop 22 provides feedback for DC signal control in the interface circuit 20. As the front-end charge amplifier 26 forms no part of the DC control loop 22, the DC control loop 22 can be considered to be separate from the signal path 24.

Figure 2:
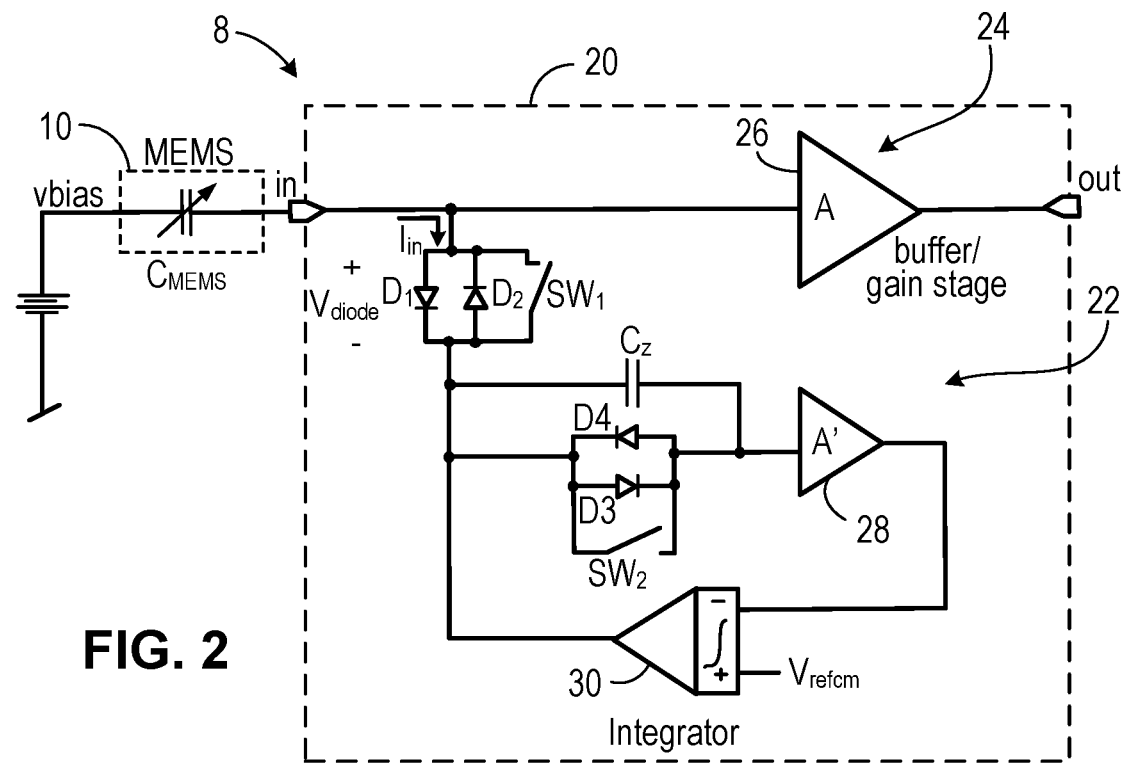
FIGS. 2, 3 and 4 illustrate further examples of a MEMS transducer coupled to an interface circuit.

The DC control loop 22 includes a second amplifier 28, feedback control element 30 that couples an output of the second amplifier 28 to its input as part of a feedback loop, high resistance (i.e., high ohmic) circuit elements 32, 34, and a capacitor Cz in parallel with the resistive element 32, 34. As shown in the example of FIG. 2, each of the high resistance elements 23, 34 can be implemented, for example, as a pair of anti-parallel diodes (i.e., D1 and D2; D3 and D4). In some implementations, each of the high resistance circuit elements 32, 34 is implemented in other ways, such as a very high resistance linear or non-linear resistor, or as MOSFETs connected to function as a pair of anti-parallel diodes. Further, the feedback control element 30 in the feedback loop can be implemented, for example, as an integrator, as shown in FIG. 2, or as a low-pass filter.

The second amplifier 28 should have similar or substantially the same input operating point and low frequency gain as the front-end charge amplifier 26 in the signal path 24 (i.e., within manufacturing tolerances). As illustrated in the example of FIG. 2, the output of the second amplifier 28 is coupled to an input of the integrator 30, which also receives a reference signal ($V_{reform}$) at a second input. In the implementation of FIG. 2, the second pair of diodes D3, D4 is coupled between the output of the integrator 30 and the input of the amplifier 28. In this case, the second pair of diodes D3. D4 establishes the DC operating point of the second amplifier 28.

An advantage of the foregoing arrangement in some implementations is that the capacitor Cz can have a high capacitance value without adding to the input capacitance of the amplifier (i.e., at the interface circuit's "in" terminal). When an input current $I_{in}$ flows, the DC input voltages of the amplifiers 26, 28 differ from one another and, therefore, there also is a shift of the output voltage of the front-end charge amplifier 26 (i.e., Vout) relative to the output voltage of the second amplifier 28.

In some implementations, a first switch (sw1) is provided in parallel to the diodes D1, D2, and a second switch (sw2) is provided in parallel to the diodes D3, D4. The switches sw1, sw2 can be implemented, for example, using CMOS technology. The switches sw1, sw2 can be closed, for example, during start-up, when a large transient of the bias voltage (vbias) occurs and/or in response to detection of an overload condition. Closing the switches sw1, sw2 allows for faster settling of the DC feedback loop 22 because the input impedance at the input terminal (in) is low. The switches sw1, sw2 then can be opened at the same time, or one switch may be opened before the other switch. The latter approach can be useful, for example, to avoid the effects due to injection of current during opening of the switches.

Figure 3:
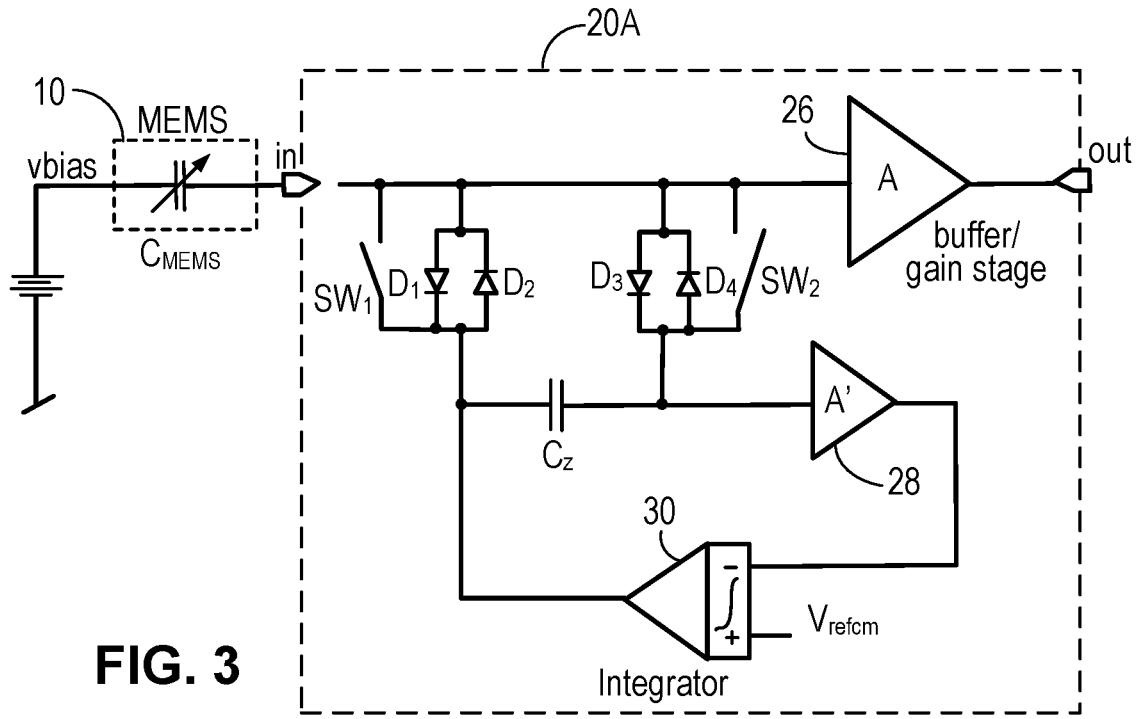
Figure 4:
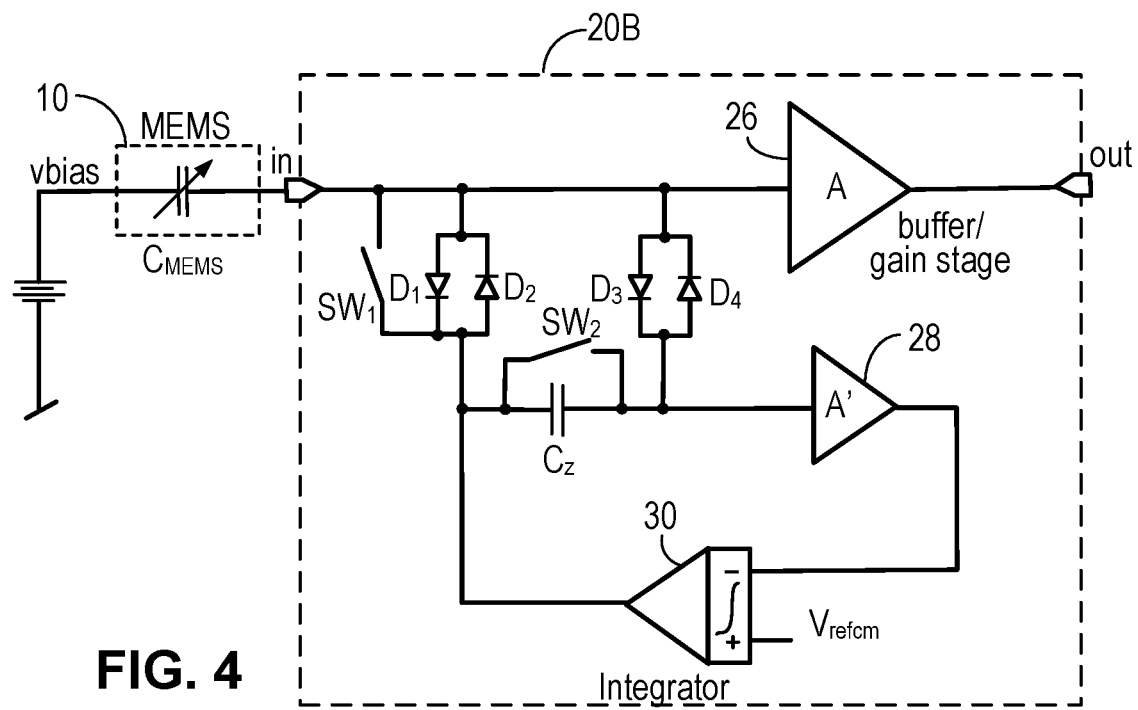

FIG. 3 shows a slightly different configuration of an interface circuit 20A in which both pairs of anti-parallel diodes D1, D2 and D3, D4 are connected between the inputs of both amplifiers 26, 28. In this case, the DC input level of the amplifier 28 in the DC control loop 22 will remain the same as the DC input for the amplifier 26 in the signal path 24 because there is no current through the diodes D3, D4. The capacitor Cz can be chosen such that the DC regulation loop remains stable. In case of an input current $I_{in}$, there will be a voltage drop across the first pair of diodes D1, D2. As there is no current through the second pair of diodes D3, D4, there will be no voltage drop across the diodes D3, D4 and thus the DC input voltage of the second amplifier 28 will follow the input of front-end charge amplifier 26. The second switch sw2 can either be in parallel with the diodes D3, D4 (as in the implementation of FIG. 3) or in parallel with the capacitor Cz (as in the implementation of FIG. 4).

In the foregoing implementations, inclusion of the second amplifier 28 as well as the second pair of diodes D3, D4 for setting the DC operating point of the amplifier 28 makes the frequency characteristic of DC regulation loop 22 independent of the input current Imo. The combination of these features can result in a fast settling amplifier even when there is an input current into the amplifier due to settling of the MEMS transducer 10 or due to a large leakage current of the MEMS transducer. Thus, the stability of the amplifier circuit can be made substantially independent of the amplifier input current $I_{in}$.

Figure 5:
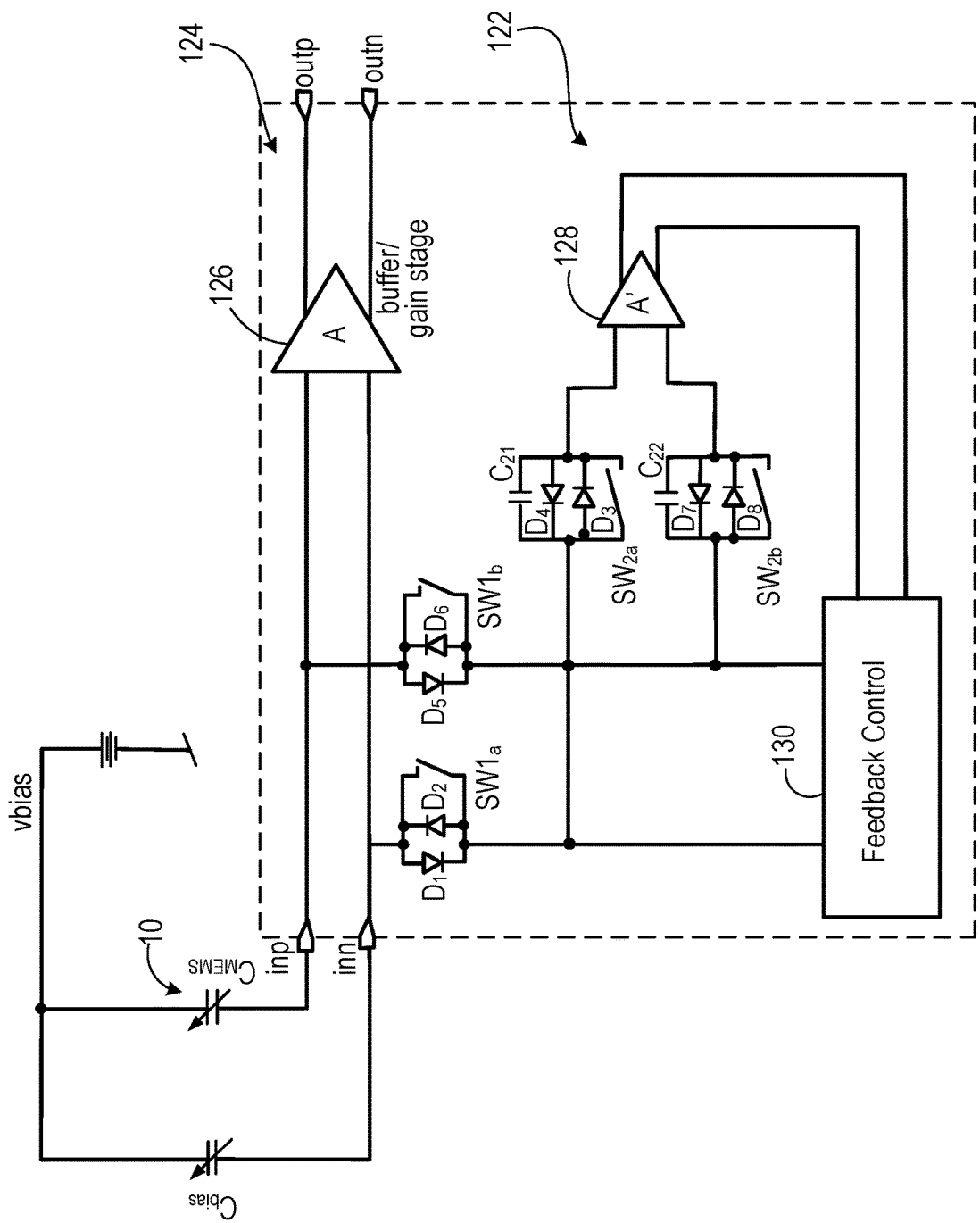
FIGS. 5, 6 and 7 illustrate examples of a MEMS transducer coupled to an interface circuit using differential inputs and outputs.
Figure 6:
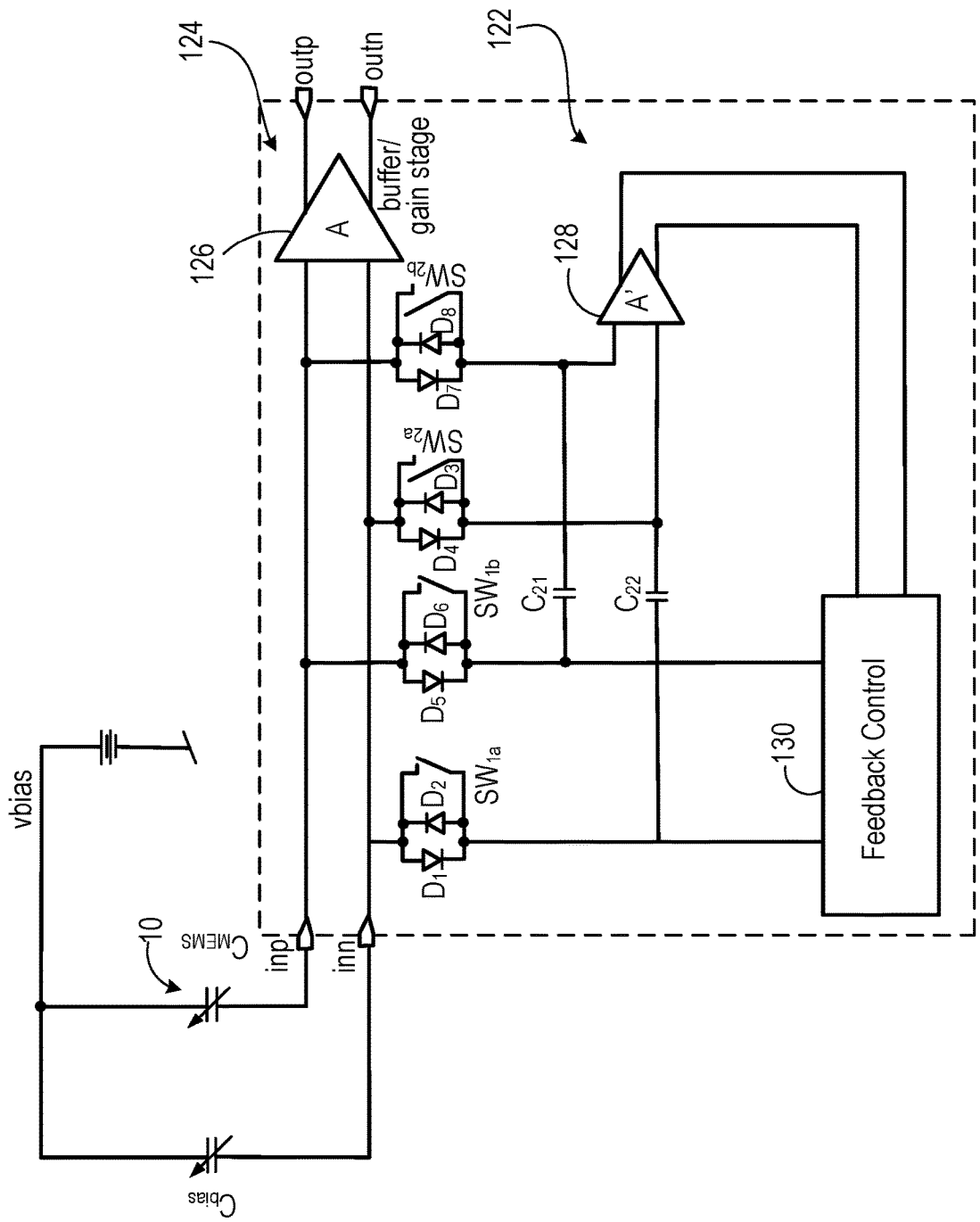
Figure 7:
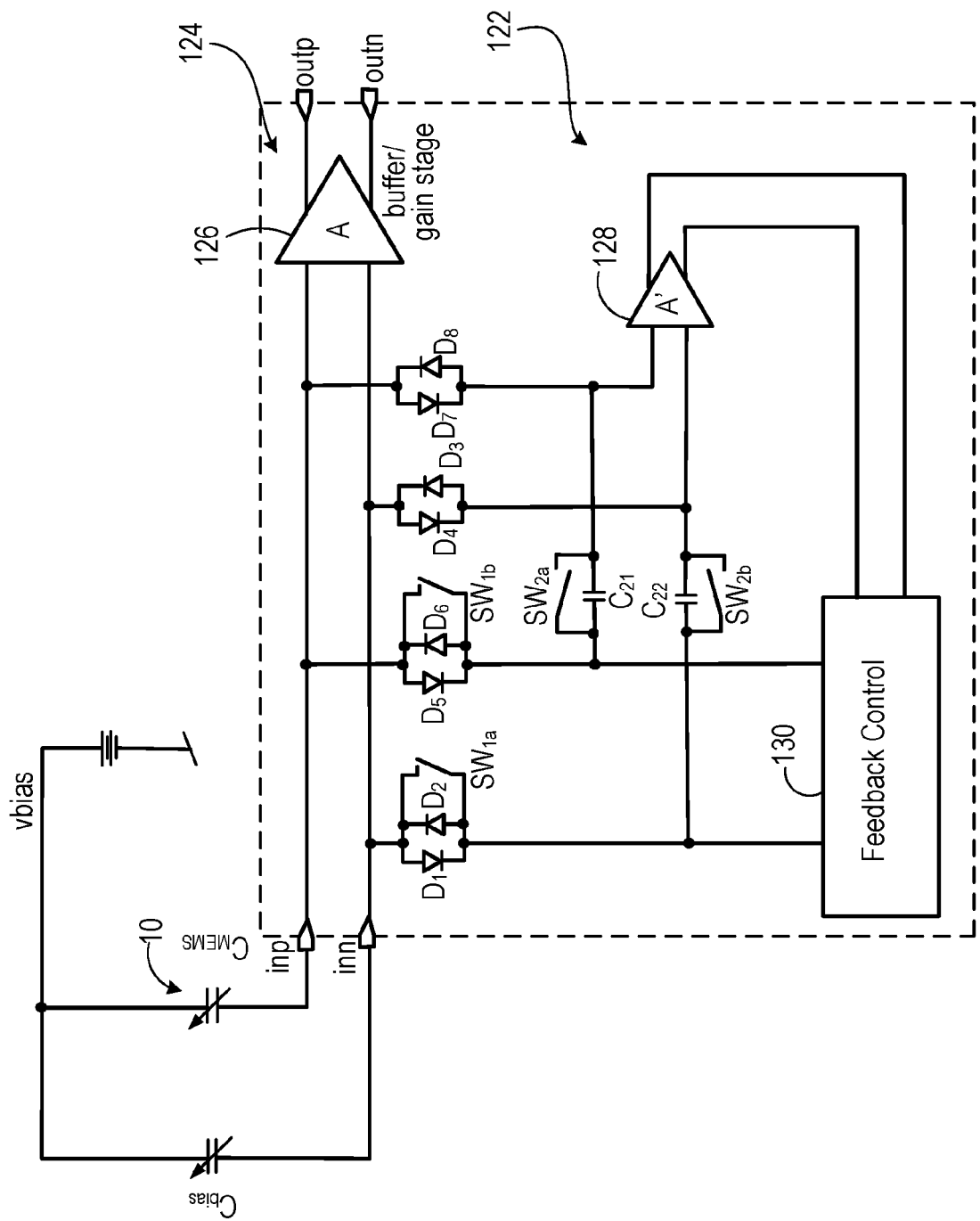

The foregoing types of architectures, in which the DC control loop 22 is separate from the signal path 24, also can be applied to differential input amplifiers. Examples are illustrated in FIGS. 5, 6 and 7, which correspond, respectively to the examples of FIGS. 2, 3 and 4 described above, modified to account for the differential inputs (inn and inp) and differential outputs (outn and outp). Thus, each of the front-end charge amplifier 126 in the signal path 124 and the amplifier 128 in the DC control loop 122 has two input and two output terminals. Further, additional pairs of anti-parallel diodes (e.g., D5 and D6; D7 and D8), additional capacitive elements (e.g., Cz2) and switches (e.g., SW1b, SW2b) are provided and function in an analogous manner to the corresponding elements already described in connection with the examples of FIGS. 2, 3 and 4. In the implementations of FIGS. 5, 6 and 7, the MEMS transducer 10 is coupled between the bias voltage (vbias) node and one of the amplifier inputs (inp). Another capacitance (Cbias) is coupled between the bias voltage (vbias) node and the other one of the amplifier inputs (inn). The Cbias capacitance can be implemented, for example, as another MEMS element or as a capacitor having a capacitance that matches the capacitance of the MEMS transducer 10.

In each of the examples of FIGS. 2-7, one or more pairs of anti-parallel diodes (e.g., D1 and D2; D3 and D4; D5 and D6; D7 and D8) can be replaced by other types of high resistance circuit elements (e.g., a very high resistance linear or non-linear resistor, or MOSFETs). Further, in each of the examples of FIGS. 2-7, the feedback control element 30, 130 in the feedback loop can be implemented, for example, as an integrator or low-pass filter.

Although the foregoing examples illustrate use of the interface circuits 20, 20A, 20B as part of a MEMS sensor (e.g., a MEMS microphone), the amplifier circuits can be used in other applications as well.

Other implementations are within the scope of the claims.

The invention claimed is:

1. An interface circuit comprising:
    a signal path including a front-end charge amplifier coupling an input of the interface circuit to an output of the interface circuit; and
    a DC control loop separate from the signal path, wherein the front-end charge amplifier is not part of the DC control loop.

2. The interface circuit of claim 1 wherein the front-end charge amplifier has an input operating point and a low frequency gain, and wherein the DC control loop includes a second amplifier having an input operating point and a low frequency gain that are the same as for the front-end charge amplifier.

3. The interface circuit of claim 2 wherein the DC control loop includes an integrator or low-pass filter, either
    wherein first and second high resistance circuit elements are coupled between an input of the front-end charge amplifier and an input of the second amplifier; or
    wherein the integrator or low-pass filter is coupled to an output of the second amplifier, and wherein a first high resistance circuit element is coupled between an output of the integrator or low-pass filter and an input of the second amplifier, and a second high resistance circuit element is coupled between the output of the integrator or low-pass filter and an input of the front-end charge amplifier.

4. The interface circuit of claim 3 wherein the interface circuit further includes a capacitor coupled between the output of the integrator or low-pass filter and the input of the second amplifier.

5. The interface circuit of claim 3 wherein at least one of the first or second high resistance circuit elements includes a pair of anti-parallel diodes.

6. The interface circuit of claim 3 further including:
    a first switch in parallel to the first high resistance circuit element; and
    a second switch in parallel to the second high resistance circuit element.

7. The interface circuit of claim 6 wherein the first and second switches are configured to be closed
    during a start-up operation; and/or
    after occurrence of an overload condition.

8. The interface circuit of claim 4 further including:
    a first switch in parallel to the first high resistance circuit element; and
    a second switch in parallel to the capacitor.

9. A MEMS sensor comprising:
    an interface circuit having an input and an output;
    a MEMS transducer having an output coupled to the input of the interface circuit, wherein the interface circuit includes:
        a signal path including a front-end charge amplifier coupling the input of the interface circuit to the output of the interface circuit; and
        a DC control loop separate from the signal path, wherein the front-end charge amplifier is not part of the DC control loop.

10. The MEMS sensor of claim 9 wherein the front-end charge amplifier has an input operating point and a low frequency gain, and wherein the DC control loop includes a second amplifier having an input operating point and a low frequency gain that are the same as for the front-end charge amplifier.

11. The MEMS sensor of claim 10 wherein the DC control loop includes an integrator or low-pass filter, either:
    wherein first and second high resistance circuit elements are coupled between an input of the front-end charge amplifier and an input of the second amplifier; or
    wherein the integrator or low-pass filter is coupled to an output of the second amplifier, and wherein a first high resistance circuit element is coupled between an output of the integrator or low-pass filter and an input of the second amplifier, and a second high resistance circuit element is coupled between the output of the integrator or low-pass filter and an input of the front-end charge amplifier.

12. The MEMS sensor of claim 11 wherein the interface circuit further includes a capacitor coupled between the output of the integrator or low-pass filter and the input of the second amplifier.

13. The MEMS sensor of claim 11 wherein at least one of the first or second high resistance circuit elements includes a pair of anti-parallel diodes.

14. The MEMS sensor of claim 11 further including:
    a first switch in parallel to the first high resistance circuit element; and
    a second switch in parallel to the second high resistance circuit element.

15. The MEMS sensor of claim 14 wherein the first and second switches are configured to be closed:
    during a start-up operation; and/or
    after occurrence of an overload condition.

16. The MEMS sensor of claim 12 further including:
    a first switch in parallel to the first high resistance circuit element; and
    a second switch in parallel to the capacitor.

17. The MEMS sensor of claim 9 wherein the interface circuit has differential inputs and outputs.

18. A MEMS sensor comprising:
    an interface circuit having an input and an output;
    a MEMS transducer having an output coupled to the input of the interface circuit, wherein the interface circuit includes:
        a signal path including a front-end charge amplifier coupling the input of the interface circuit to the output of the interface circuit; and
        a DC control loop including:
            a second amplifier having an input and an output;
            an integrator or low-pass filter having an input coupled to the output of the second amplifier;
            a capacitor coupled between an output of the integrator or low-pass filter and the input of the second amplifier;
    the interface circuit further including a first high resistive circuit element and a second high resistive circuit element, wherein at least one of the high resistive circuit elements is coupled between the output of the integrator or low-pass filter and the input of the front-end charge amplifier.

19. The MEMS sensor of claim 18 wherein the MEMS transducer is configured as a MEMS microphone.

* * * * *